(12) United States Patent
Son et al.

(10) Patent No.: US 10,566,340 B1
(45) Date of Patent: Feb. 18, 2020

(54) SEMICONDUCTOR MEMORY DEVICE

(71) Applicant: SK hynix Inc., Gyeonggi-do (KR)

(72) Inventors: Chang-Man Son, Gyeonggi-do (KR); Hyun-Soo Shin, Gyeonggi-do (KR); Jae-Eun Jeon, Seoul (KR); Sung-Hyun Hwang, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/202,607

(22) Filed: Nov. 28, 2018

(30) Foreign Application Priority Data

Aug. 16, 2018 (KR) .......................... 10-2018-0095331

(51) Int. Cl.
*H01L 27/11565* (2017.01)
*H01L 27/11568* (2017.01)
*H01L 27/11573* (2017.01)

(52) U.S. Cl.
CPC .. *H01L 27/11568* (2013.01); *H01L 27/11565* (2013.01); *H01L 27/11573* (2013.01)

(58) Field of Classification Search
CPC ......... H01L 27/11568; H01L 27/11565; H01L 27/11573
USPC .......................................................... 257/316
See application file for complete search history.

(56) References Cited

U.S. PATENT DOCUMENTS

| 5,982,671 A | * | 11/1999 | Kang | .................... H01L 27/115 365/185.33 |
| 7,288,812 B2 | | 10/2007 | Riedel | |
| 2016/0071866 A1 | | 3/2016 | Shimojo et al. | |

FOREIGN PATENT DOCUMENTS

KR      1020160146223      12/2016

* cited by examiner

*Primary Examiner* — Tu-Tu V Ho
(74) *Attorney, Agent, or Firm* — IP & T Group LLP

(57) ABSTRACT

A semiconductor memory device includes a plurality of bit lines disposed over memory cells along a second direction intersecting with a first direction, and extending in the first direction; and a plurality of first wirings and a plurality of second wirings alternately disposed along the second direction over the bit lines, and extending in the first direction while being bent into zigzag shapes.

20 Claims, 13 Drawing Sheets

SEMICONDUCTOR MEMORY DEVICE

CROSS-REFERENCE TO RELATED APPLICATION

The present application claims priority under 35 U.S.C. § 119(a) to Korean Patent Application No. 10-2018-0095331, filed on Aug. 16, 2018, which is incorporated herein by reference in its entirety.

BACKGROUND

1. Technical Field

Various embodiments of the present invention generally relate to a semiconductor memory device and, more particularly, to a semiconductor memory device having improved wiring structure that allows enhanced integration, and performance and lower power consumption.

2. Related Art

In recent years, memory devices trend toward larger capacity and higher degree of integration in step with increased multifunctionality and capacity of the information communication devices employing the memory devices. As the size of the memory cells shrinks for obtaining higher integration, the structure of operation circuits and wirings which are included in a memory device for the operation and electrical coupling of the memory device becomes more complex and a potential bottleneck in the efforts to improve the memory devices. Accordingly, a memory device having an improved degree of integration and excellent electrical characteristics due to an improved wiring structure would be highly desirable in the art.

SUMMARY

Various embodiments of the present invention provide a semiconductor memory device having improved wiring structure that allows enhanced integration, and performance and lower power consumption.

In an embodiment, a semiconductor memory device may include: a plurality of bit lines disposed over memory cells along a second direction intersecting with a first direction, and extending in the first direction; and a plurality of first wirings and a plurality of second wirings alternately disposed along the second direction over the bit lines, and extending in the first direction while being bent into zigzag shapes.

In an embodiment, a semiconductor memory device may include: a plane disposed in a cell region, and including a plurality of memory cells; a plurality of bit lines disposed over the plane along a second direction intersecting with a first direction, and extending in the first direction; a plurality of wirings disposed over the bit lines along the second direction, and extending in the first direction while being bent into zigzag shapes; and a plurality of contact pads respectively coupled to convex portions of a wiring which is positioned at an edge of the cell region.

In an embodiment, a semiconductor memory device may include: a plurality of planes each including a plurality of memory cells; a plurality of bit lines disposed over the planes along a second direction intersecting with a first direction, and extending in the first direction; and a plurality of first wirings and a plurality of second wirings alternately disposed along the second direction over the bit lines, and extending in the first direction while being bent into zigzag shapes.

In an embodiment, A semiconductor memory device comprising: a plurality of bit lines disposed over memory cells; and a plurality of first and second wirings alternately disposed along a second direction over the bit lines, and extending in a first direction while being bent into zigzag shapes. Each of the first and second wirings includes a crack suppressing structure.

These and other features and advantages of the present invention will become clear to those with ordinary skill in the art to which the invention pertains or belongs from the following detailed description of exemplary embodiments in conjunction with the accompanying drawings.

DETAILED DESCRIPTION

Figure 1:
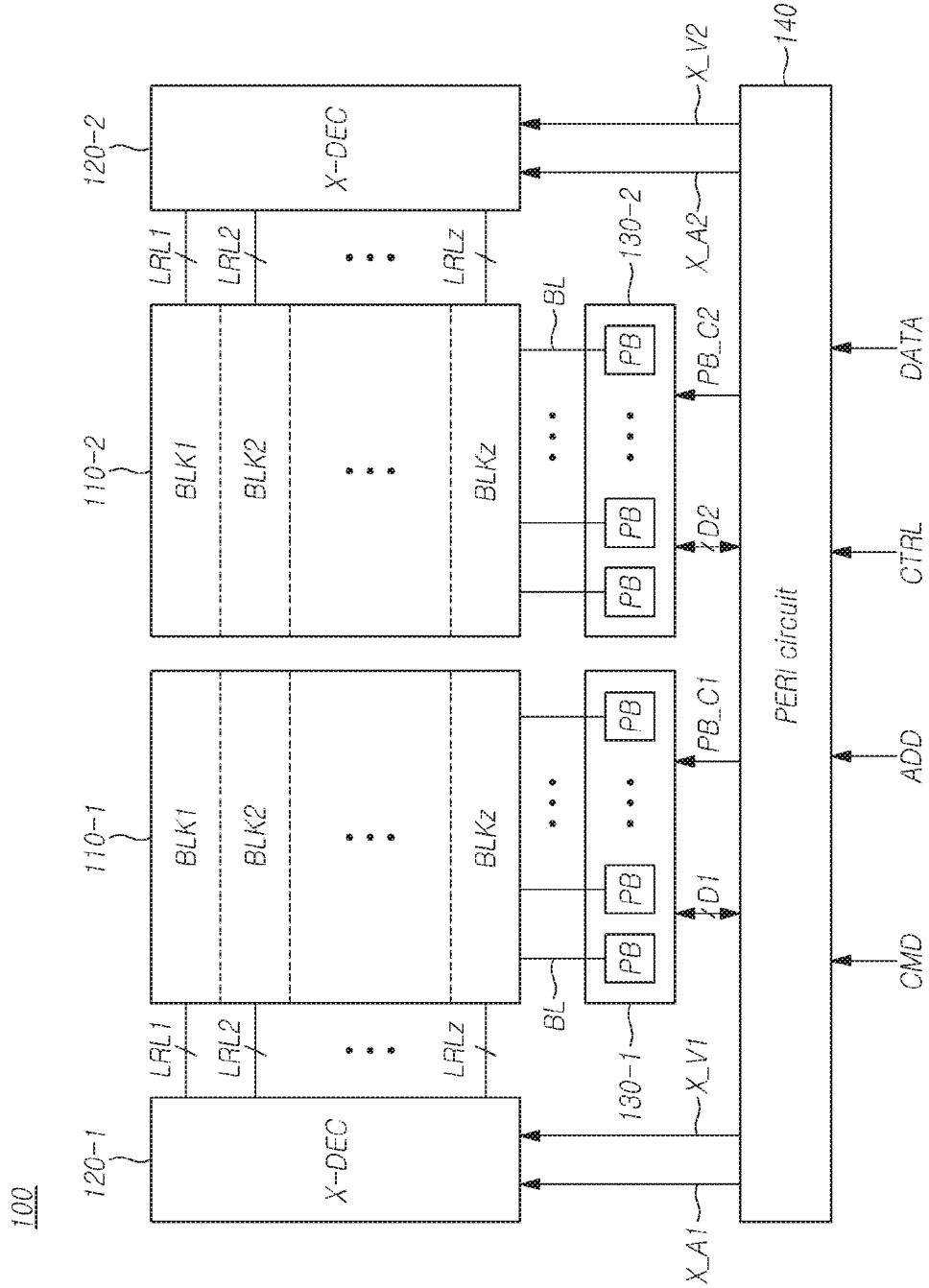
FIG. 1 is a block diagram illustrating an exemplary configuration of a semiconductor memory device in accordance with an embodiment of the present disclosure.

Hereinafter, a semiconductor memory device will be described below with reference to the accompanying drawings through various examples of embodiments.

The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present invention as defined in the appended claims.

The present invention is described herein with reference to cross-section and/or plan illustrations of idealized embodiments of the present invention. However, embodiments of the present invention should not be construed as limiting the inventive concept. Although a few embodiments of the present invention will be shown and described, it will be appreciated by those of ordinary skill in the art that changes may be made in these embodiments without departing from the principles and spirit of the present invention.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention.

As used herein, singular forms are intended to include the plural forms as well, unless the context clearly indicates otherwise.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure.

It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

Hereinbelow, in the accompanying drawings, a direction perpendicular to the top surface of a substrate is defined as a third direction TD, and two directions parallel to the top surface of the substrate and intersecting with each other are defined as a first direction FD and second direction SD, respectively. The substrate may correspond to a single layer or a multi-layer substrate. The second direction SD may correspond to the extending direction of word lines, and the first direction FD may correspond to the extending is direction of bit lines. The first direction FD and the second direction SD may intersect substantially perpendicularly with each other. In the drawings, a direction indicated by an arrow and a direction opposite thereto represent the same direction.

FIG. 1 is a block diagram illustrating an exemplary configuration of a semiconductor memory device in accordance with an embodiment of the present disclosure.

Referring to FIG. 1, a semiconductor memory device 100 in accordance with an embodiment may include first and second planes 110-1 and 110-2, first and second row decoders 120-1 and 120-2, first and second page buffer circuits 130-1 and 130-2 and a peripheral circuit 140.

The first and second planes 110-1 and 110-2 may each include a plurality of memory cells which have states corresponding to the data stored therein. A memory cell may be accessed by a word line and a bit line. A memory cell may be a volatile memory cell which loses data stored therein in the case where power supply is interrupted, or may be a nonvolatile memory cell which retains data stored therein even though power supply is interrupted.

While it is described below that the semiconductor memory device 100 is a vertical NAND flash device, it is to be understood that the technical spirit of the present disclosure is not limited thereto.

Each of the first and second planes 110-1 and 110-2 may include a plurality of memory blocks BLK1 to BLKz (z is a natural number of 2 or more). While not shown, each of the memory blocks BLK1 to BLKz may include a plurality of cell strings. A cell string may include at least one drain select transistor, a plurality of memory cells and at least one source select transistor which are coupled in series.

The first plane 110-1 may be coupled to the first row decoder 120-1 through row lines LRL1 to LRLz. The second plane 110-2 may be coupled to the second row decoder 120-2 through row lines LRL1 to LRLz. An i^th (i is a natural number of z or less) memory block BLKi included in the first plane 110-1 or the second plane 110-2 may be coupled to the corresponding row decoder 120-1 or 120-2 through row lines LRLi. The row lines RL may include one or more drain select lines, a plurality of word lines and one or more source select lines. The i^th memory block BLKi may be defined as one of the memory blocks BLK1 to BLKz included in the first plane 110-1 and the second plane 110-2, and the row lines LRLi may be defined as row lines which are coupled to the i^th memory block BLKi.

The first plane 110-1 may be coupled to the first page buffer circuit 130-1 through bit lines BL. The second plane 110-2 may be coupled to the second page buffer circuit 130-2 through bit lines BL.

The first plane 110-1 and the second plane 110-2 may be controlled independently of each other in their operations (for example, program operations and read operations) through the first page buffer circuit 130-1 and the second page buffer circuit 130-2. By being controlled independently of each other in this way, the first plane 110-1 and the second plane 110-2 may perform specific operations in parallel or individually. For example, in the case where the size of each page of the first plane 110-1 and the second plane 110-2 is 16 KB, the first and second planes 110-1 and 110-2 may operate in parallel and process data of 32 KB, or only one of the first and second planes 110-1 and 110-2 may operate and process data of 16 KB.

The first row decoder 120-1 may select any one among the memory blocks BLK1 to BLKz included in the first plane 110-1, in response to a row address X_A1 provided from the peripheral circuit 140. The first row decoder 120-1 may transfer an operating voltage X_V1 provided from the peripheral circuit 140, to the local row lines LRLi coupled to a selected memory block. The second row decoder 120-2 may also operate in a manner similar to the first row decoder 120-1.

The first and second page buffer circuits 130-1 and 130-2 may include a plurality of page buffers PB which are respectively coupled to the bit lines BL.

The first page buffer circuit 130-1 may receive a first page buffer control signal PB_C1 from the peripheral circuit 140, and may transmit and receive a data signal D1 to and from the peripheral circuit 140. The first page buffer circuit 130-1 may control the bit lines BL arranged in the first plane 110-1, in response to the first page buffer control signal PB_C1. For example, the first page buffer circuit 130-1 may detect data stored in a memory cell of the first plane 110-1, by sensing the signal of a bit line BL of the first plane 110-1 in response to the first page buffer control signal PB_C1, and may transmit the data signal D1 to the peripheral circuit 140 depending on the detected data. The first page buffer circuit 130-1 may apply a signal to a bit line BL based on the data signal D1 received from the peripheral circuit 140 in response to the first page buffer control circuit PB_C1, and thereby, may write data in a memory cell of the first plane 110-1. The first page buffer circuit 130-1 may write data in or read data from a memory cell coupled to a word line which is activated by the first row decoder 120-1. The second page buffer circuit 130-2 may also operate in a manner similar to the first page buffer circuit 130-1.

The peripheral circuit 140 may receive a command signal CMD, an address signal ADD and a control signal CTRL from outside the semiconductor memory device 100, and may transmit and receive data DATA to and from a device outside the semiconductor memory device 100, for example, a memory controller. The peripheral circuit 140 may output signals for writing data in the first and second planes 110-1 and 110-2 or reading data from the first and second planes 110-1 and 110-2, for example, the row addresses X_A1 and X_A2, the page buffer control signals PB_C1 and PB_C2 and so forth, based on the command signal CMD, the address signal ADD and the control signal CTRL. The peripheral circuit 140 may generate various voltages including the operating voltages X_V1 and X_V2, which are required in the semiconductor memory device 100.

Hereinbelow, in the accompanying drawings, two directions that are parallel to the top surface of a substrate and intersect with each other are defined as a first direction FD and a second direction SD, respectively, and a direction that vertically projects from the top surface of the substrate is defined as a third direction TD. The first direction FD may correspond to the extending direction of bit lines or the arrangement direction of row lines, and the second direction SD may correspond to the arrangement direction of the bit lines or the extending direction of the row lines. The first direction FD and the second direction SD may substantially perpendicularly intersect with each other. In the drawings, a direction indicated by an arrow and a direction opposite thereto represent the same direction.

Figure 2:
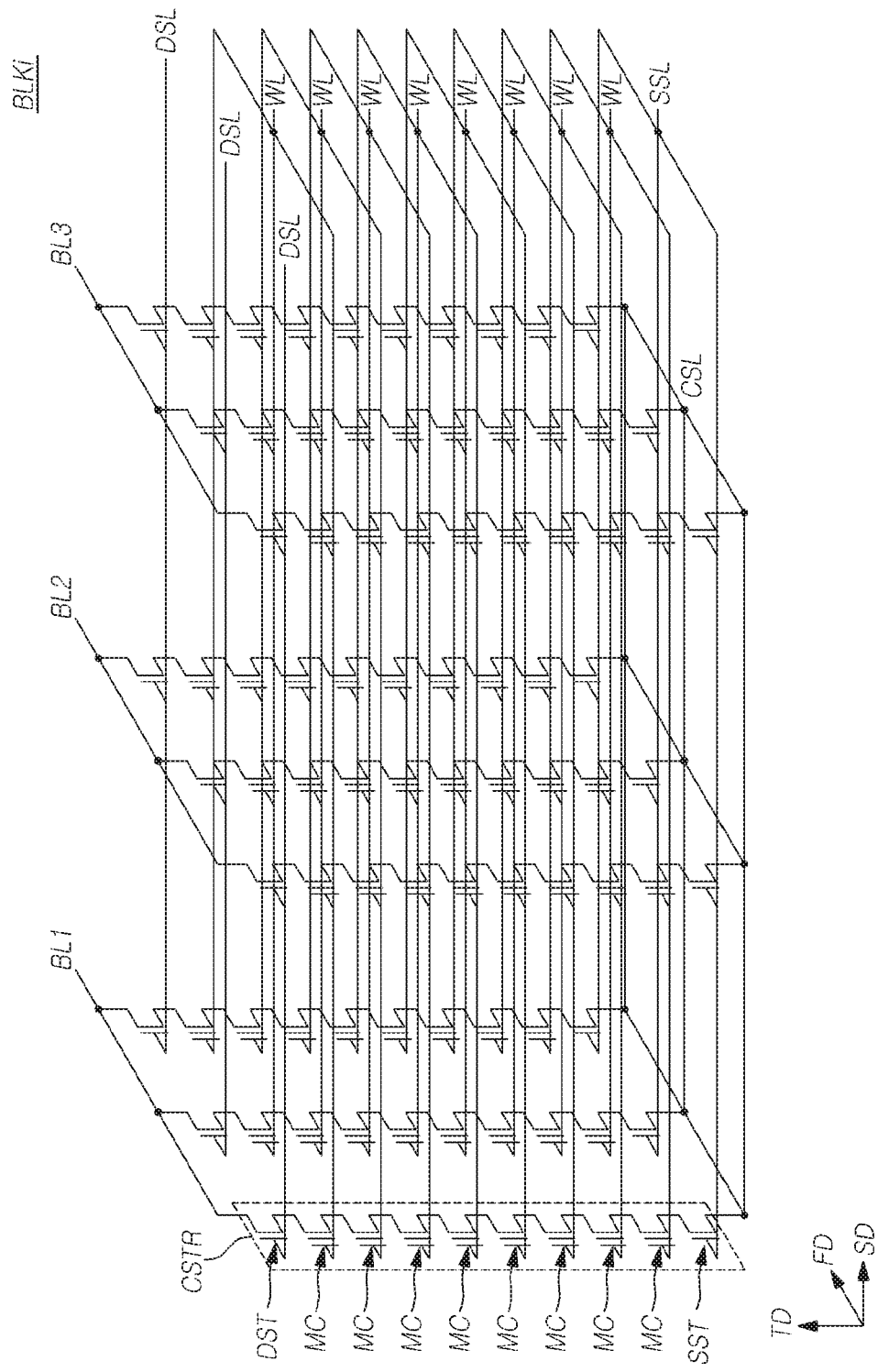
FIG. 2 is an equivalent circuit diagram illustrating an exemplary configuration of one of the memory blocks shown in FIG. 1.

FIG. 2 is an equivalent circuit diagram illustrating an exemplary configuration of one memory block BLKi among the memory blocks shown in FIG. 1.

Referring to FIG. 2, the memory block BLKi may include a plurality of cell strings CSTR which are coupled between a plurality of bit lines BL and a common source line CSL.

The bit lines BL may extend in the first direction FD and be arranged along the second direction SD. A plurality of cell strings CSTR may be coupled in parallel to each of the bit lines BL. The cell strings CSTR may be coupled in common to the common source line CSL. That is to say, the plurality of cell strings CSTR may be disposed between the plurality of bit lines BL and one common source line CSL.

Each of the cell strings CSTR may include a drain select transistor DST which is coupled to a bit line BL, a source select transistor SST which is coupled to the common source line CSL, and a plurality of memory cells MC which are coupled between the drain select transistor DST and the source select transistor SST. The drain select transistor DST, the memory cells MC and the source select transistor SST may be coupled in series along the third direction TD.

Drain select lines DSL, a plurality of word lines WL and a source select line SSL which extend in the second direction SD may be stacked along the third direction TD between the bit lines BL and the common source line CSL. The drain select lines DSL may be respectively coupled to the gates of corresponding drain select transistors DST. The word lines WL may be respectively coupled to the gates of corresponding memory cells MC. The source select line SSL may be coupled to the gates of source select transistors SST.

Figure 3:
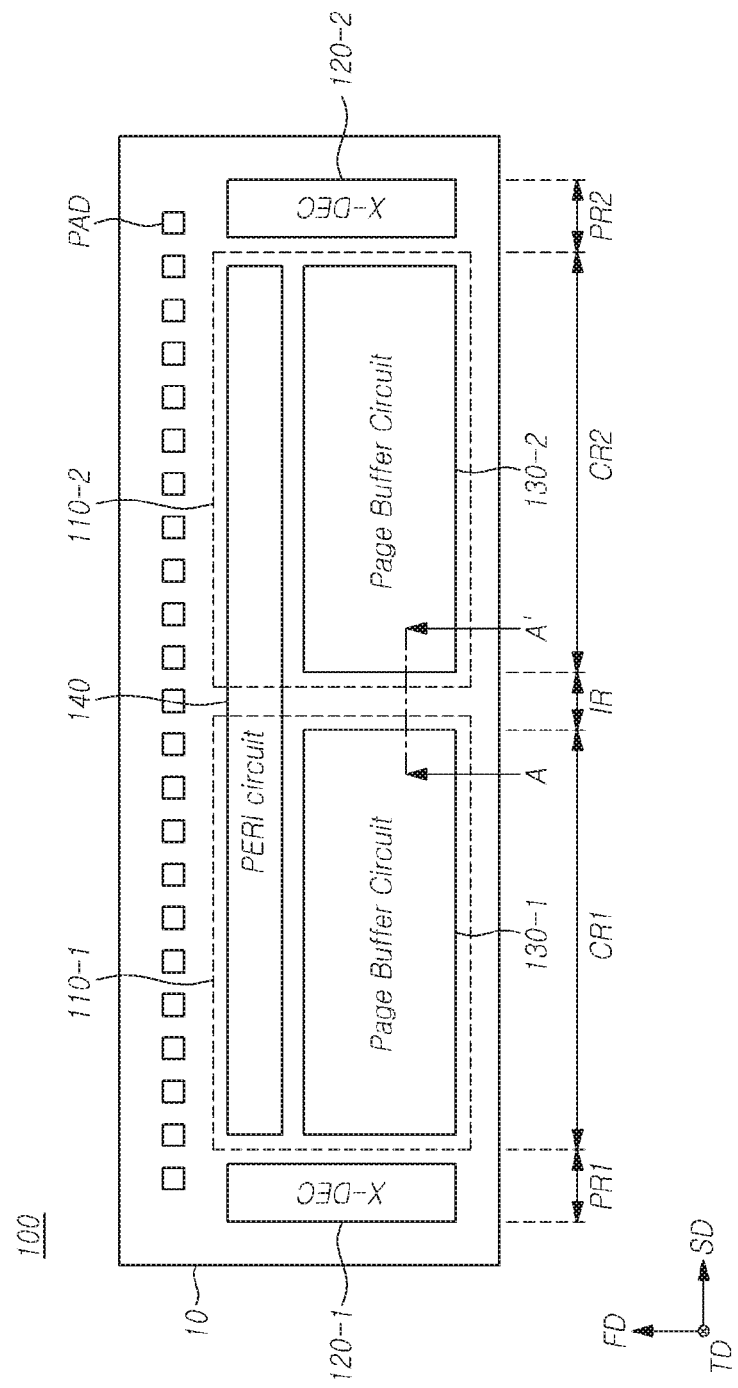
FIG. 3 is a layout diagram schematically illustrating an exemplary configuration of the semiconductor memory device shown in FIG. 1.
Figure 4:
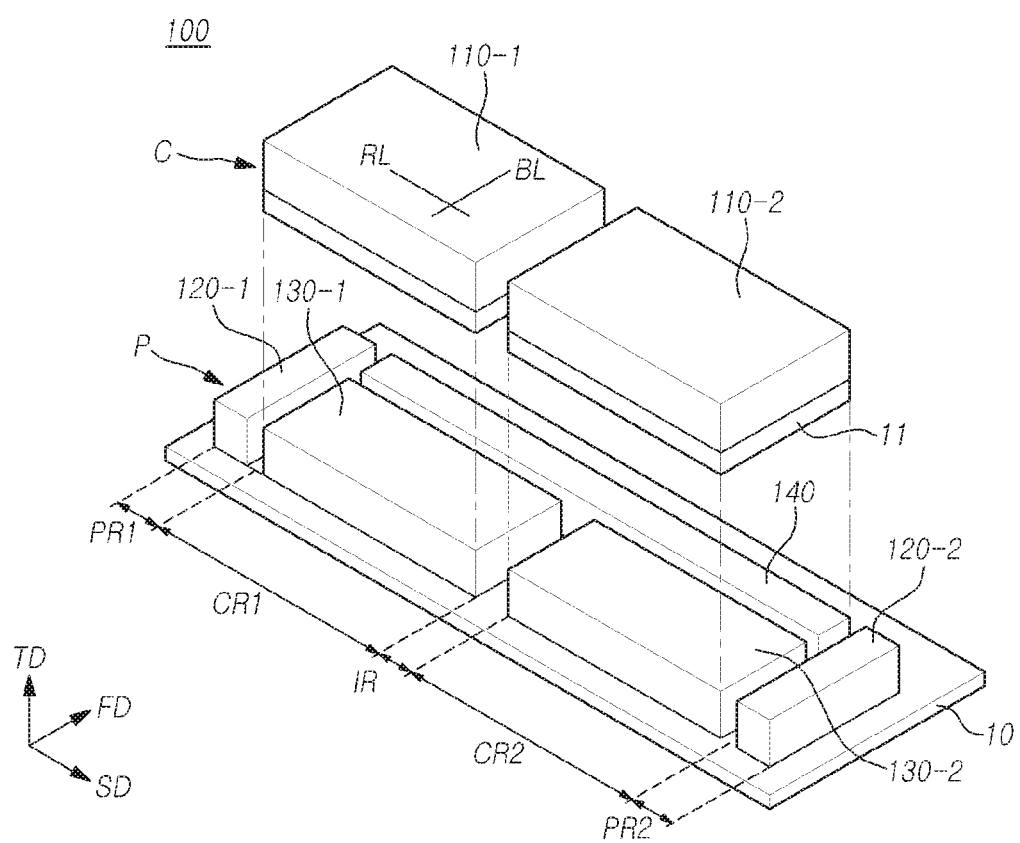
FIG. 4 is a perspective view schematically illustrating an exemplary configuration of the semiconductor memory device shown in FIG. 3.

FIG. 3 is a layout diagram schematically illustrating an exemplary configuration of the semiconductor memory device shown in FIG. 1, and FIG. 4 is a perspective view schematically illustrating an exemplary configuration of the semiconductor memory device shown in FIG. 3.

Referring to FIGS. 3 and 4, a memory structure C may include the first and second planes 110-1 and 110-2. A logic structure P may include the first and second row decoders 120-1 and 120-2, the first and second page buffer circuits 130-1 and 130-2 and the peripheral circuit 140. At least a part of the logic structure P may be laid out under the memory structure C. That is to say, the semiconductor memory device 100 may have a PUC (peri under cell) structure. In the embodiment described with reference to FIGS. 3 and 4, it is illustrated that the first and second page buffer circuits 130-1 and 130-2 and the peripheral circuit 140 of the logic structure P are laid out under the memory structure C.

The first and second row decoders 120-1 and 120-2, the first and second page buffer circuits 1304 and 130-2 and the peripheral circuit 140 may be disposed on a substrate 10, and the first and second planes 110-1 and 110-2 may be disposed on a source plate 11.

The semiconductor memory device 100 may include first and second cell regions CR1 and CR2, an interval region IR and first and second peripheral regions PR1 and PR2. The first and second cell regions CR1 and CR2 may be laid out along the second direction SD. The interval region IR may be laid out between the first cell region CR1 and the second cell region CR2. The first peripheral region PR1 may be laid out adjacent to the first cell region CR1 in the second direction SD at a periphery of the substrate 10, and the second peripheral region PR2 may be laid out adjacent to the second cell region CR2 in the second direction SD at a periphery of the substrate 10.

The first plane 110-1 may be disposed on the source plate 11 of the first cell region CR1, and the second plane 110-2 may be disposed on the source plate 11 of the second cell region CR2.

Input/output pads PAD as the external contacts of the semiconductor memory device 100 for electrical coupling with an external device may be laid out along the second direction SD at an edge of the substrate 10. While not shown, the input/output pads PAD may be electrically coupled with the peripheral circuit 140 through a plurality of wirings.

The peripheral circuit 140 may be laid out adjacent to the input/output pads PAD in the first direction FD. At least a part of the peripheral circuit 140 may overlap with the first and second planes 110-1 and 110-2 in the third direction TD.

The first page buffer circuit 130-1 may be laid out in the first cell region CR1, and may overlap with the first plane 110-1 in the third direction TD. The second page buffer circuit 130-2 may be laid out in the second cell region CR2, and may overlap with the second plane 110-2 in the third direction TD.

The first and second page buffer circuits 130-1 and 130-2 may be laid out to have shapes extending along the second direction SD as the arrangement direction of bit lines BL. The elements included in the respective first and second page buffer circuits 130-1 and 130-2, that is, the page buffers PB (see FIG. 1), may be laid out along the second direction SD. The first page buffer circuit 130-1 may be laid out to have substantially the same length as the first plane 110-1 in the second direction SD, and the second page buffer circuit 130-2 may be disposed to have substantially the same length as the second plane 110-2 in the second direction SD.

The first row decoder 120-1 may be laid out to have a shape extending along the first direction FD as the arrangement direction of row lines RL in the first peripheral region PR1, and the second row decoder 120-2 may be laid out to have a shape extending along the first direction FD in the second peripheral region PR2.

Figure 5:
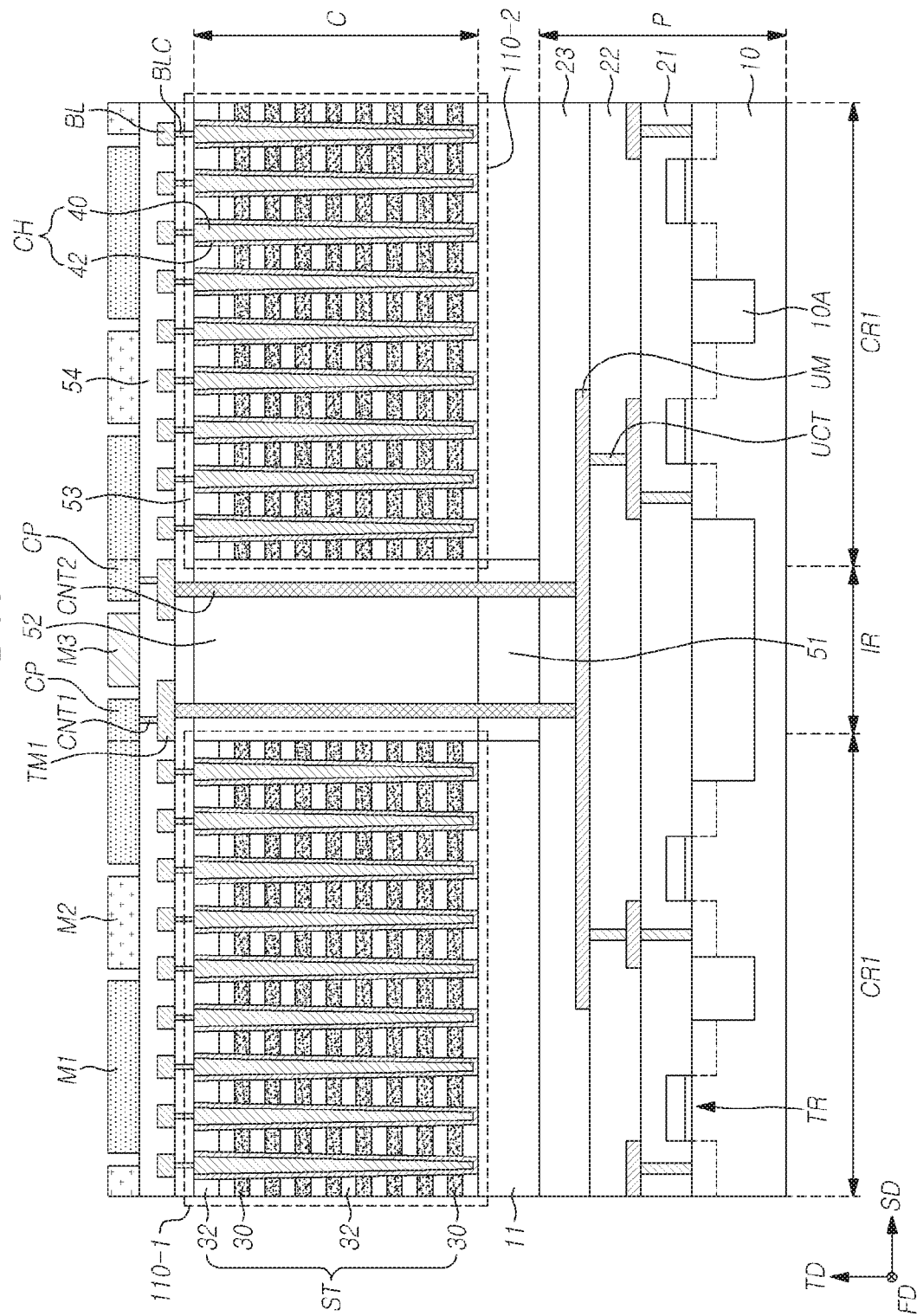
FIG. 5 is a cross-sectional view illustrating an exemplary configuration of a semiconductor memory device in accordance with an embodiment of the present disclosure.

FIG. 5 is a cross-sectional view illustrating an exemplary configuration of a part of a semiconductor memory device in accordance with the embodiment.

Referring to FIG. 5, the substrate 10 may be a semiconductor substrate which has a first conductivity type, for example, a P-type conductivity. The semiconductor substrate may be formed of or include at least one selected from the group including a monocrystalline silicon layer, an SOI (silicon on insulator), a silicon layer formed on a silicon germanium (SiGe) layer, a monocrystalline silicon layer formed on a dielectric layer and a polysilicon layer formed on a dielectric layer.

The logic structure P may be disposed on the substrate 10. As described above with reference to FIGS. 3 and 4, the logic structure P may include logic circuits such as the first and second row decoders 120-1 and 120-2, the first and second page buffer circuits 130-1 and 130-2 and the peripheral circuit 140. The logic circuits may include a plurality of logic transistors TR. The logic transistors TR may be planar transistors. Although FIG. 5 shows the case where the logic transistors are planar transistors, the form of the logic transistors are not limited thereto. For example, the logic transistors TR may be vertical transistors. The logic transistors TR may be disposed in the active region defined by an isolation layer 10A. The logic structure P may include a plurality of bottom wirings UM which are electrically coupled to the logic circuits. The bottom wirings UM may be electrically coupled to the logic circuits through bottom contacts UCT. The logic structure P may include a bottom dielectric layer which covers the logic circuits, the bottom wirings UM and the bottom contacts UCT. The bottom dielectric layer be formed or include a silicon oxide layer, a silicon nitride layer, a silicon oxynitride layer, and any combination thereof. The bottom dielectric layer may be a single layer or a multi-layer. It is illustrated in the embodiment of FIG. 5 that the bottom dielectric layer is made up of first to third bottom dielectric layers 21, 22 and 23, however, the invention may not be limited in this way.

The source plate 11 may be disposed on the third bottom dielectric layer 23. The source plate 11 may be formed of polycrystalline silicon. Unlike the substrate 10 which may use a monocrystalline silicon substrate, since the source plate 11 should be formed on the third bottom dielectric layer 23, the source plate 11 may be formed of polycrystalline silicon. The source plate 11 may not be disposed in the interval region IR. In other words, the source plate 11 may expose the third bottom dielectric layer 23 of the interval region IR.

The memory structure C may be disposed on the source plate 11. As described above with reference to FIGS. 3 and 4, the memory structure C may include the first plane 110-1 and the second plane 110-2. The first plane 110-1 may be disposed on the source plate 11 of the first cell region CR1, and the second plane 110-2 may be disposed on the source plate 11 of the second cell region CR2.

Each of the first and second planes 110-1 and 110-2 may include a stack structure ST and a plurality of channel structures CH penetrating the stack structure ST. The stack structure ST may include a plurality of gate electrode layers 30 and a plurality of dielectric layers 32 which are alternately stacked. At least one layer from the lowermost among the gate electrode layers 30 may be used as a source select line. At least one layer from the uppermost among the gate electrode layers 30 may be used as a drain select line. The gate electrode layers 30 between the source select line and the drain select line may be used as word lines.

The channel structures CH may be coupled to the source plate 11 by passing through the gate electrode layers 30 and the dielectric layers 32. Each of the channel structures CH may include a channel layer 40 and a gate dielectric layer 42. The channel layer 40 may include polysilicon or monocrystalline silicon, and may include a P-type impurity such as boron (B) in some regions. The channel layer 40 may have the shape of a pillar or a solid cylinder which is completely filled up to its center. While not shown, in a variation of this embodiment, the channel layer 40 may have the shape of a tube in which a center region is open. In this case, a buried dielectric layer may be formed in the open center region of the channel layer 40.

The gate dielectric layer 42 may have the shape of a straw or a cylindrical shell which surrounds the outer wall of the channel layer 40. While not shown, the gate dielectric layer 42 may include a tunnel dielectric layer, a charge storage layer and a blocking layer which are sequentially stacked from the outer wall of the channel layer 40. The tunnel dielectric layer may be formed of or include a silicon oxide, a hafnium oxide, an aluminum oxide, a zirconium oxide or a tantalum oxide. The charge storage layer may be formed of or include a silicon nitride, a boron nitride, a silicon boron nitride or polysilicon doped with an impurity. The blocking layer may be formed of or include a single layer or a stack layer of a silicon oxide, a silicon nitride, a hafnium oxide, an aluminum oxide, a zirconium oxide and a tantalum oxide. In some embodiments, the gate dielectric layer 42 may have an ONO (oxide-nitride-oxide) stack structure in which an oxide layer, a nitride layer and an oxide layer are sequentially stacked. A source select transistor may be formed where the source select line surrounds a channel structure CH, memory cells may be formed is where the word lines surround the channel structure CH, and a drain select transistor may be formed where the drain select line surrounds the channel structure CH. By the above-described structure, a plurality of cell strings each including a source select transistor, memory cells and a drain select transistor which are disposed along each of the channel structures CH may be provided.

A first top dielectric layer 51 may be disposed in the interval region IR to cover the top surface of the third bottom dielectric layer 23 and the side surface of the source plate 11. A second top dielectric layer 52 may be disposed on the first top dielectric layer 51 and cover the side surface of the stack structure ST. A third top dielectric layer 53 may be disposed on the stack structure ST and the second top dielectric layer 52. A plurality of bit lines BL may be disposed on the third top dielectric layer 53 of the first and second cell regions CR1 and CR2.

The bit lines BL may extend along the first direction FD and may be arranged at a regular interval along the second direction SD. Bit line contacts BLC may be formed in the third top dielectric layer 53 under the bit lines BL to electrically couple the bit lines BL and the channel structures CH. The channel structures CH which are disposed in a line along the first direction FD may be electrically coupled to a single bit line BL. A fourth top dielectric layer 54 may be formed on the third top dielectric layer 53 to cover the bit lines BL. The first to fourth top dielectric layers 51 to 54 may be formed or include a silicon oxide layer, a silicon nitride layer, a silicon oxynitride layer and any combination thereof.

A plurality of wirings M1, M2 and M3 may be disposed on the fourth top dielectric layer 54.

The wirings M1, M2 and M3 may include first and second wirings M1 and M2 which are disposed in the first and second cell regions CR1 and CR2 and a third wiring M3 which is disposed in the interval region IR. The first wirings M1 and the second wirings M2 may be alternately disposed along the second direction SD in the first and second cell regions CR1 and CR2.

A voltage loaded to the first wirings M1 and a voltage loaded to the second wirings M2 may be different from each other. A voltage loaded to the third wiring M3 may be different from the voltages loaded to the first and second wirings M1 and M2. For example, a ground voltage (VSS) may be loaded to the first wirings M1, a source voltage (VSL) may be loaded to the second wirings M2, and a power supply voltage (VCC) may be loaded to the third wiring M3. The first wirings M1 may play the role of transferring the ground voltage (VSS) to the logic circuits, and the second wirings M2 may play the role of transferring the source voltage (VSL) to the source plate 11. The third wiring M3 may play the role of transferring the power supply voltage (VCC) to the logic circuits.

The first and second wirings M1 and M2 disposed in the first and second cell regions CR1 and CR2 may overlap with the underlying bit lines BL in the third direction TD, and coupling capacitances may be induced where the first and second wirings M1 and M2 and the bit lines BL overlap with each other.

The areas where the bit lines BL overlap with the first wirings M1 may be different for the respective bit lines BL. Similarly, the areas where the bit lines BL overlap with the second wirings M2 may be different for the respective bit lines BL. Since the bit lines BL have the coupling capacitances that are proportional to overlapping areas with the first wirings M1 or/and the second wirings M2, in the case where the overlapping areas with the first wirings M1 or/and the second wirings M2 are different from one another, deviations in the coupling capacitances occur among the bit lines BL, and accordingly, variation in the distributions of the memory cells coupled to the bit lines BL may increase.

If the first and second wirings M1 and M2 are disposed outside the first and second cell regions CR1 and CR2, since the first and second wirings M1 and M2 do not overlap with the bit lines BL, variation in the distributions of the memory cells due to the deviations in the coupling capacitances among the bit lines BL may be suppressed. However, in this case, since an additional area is required for the layout of the first and second wirings M1 and M2, the size of the semiconductor memory device 100 increases.

Hence, in the described embodiment, it is possible to provide a semiconductor memory device capable of suppressing variation in the distributions of memory cells by reducing deviations in coupling capacitances among bit lines without increasing a size.

Figure 6:
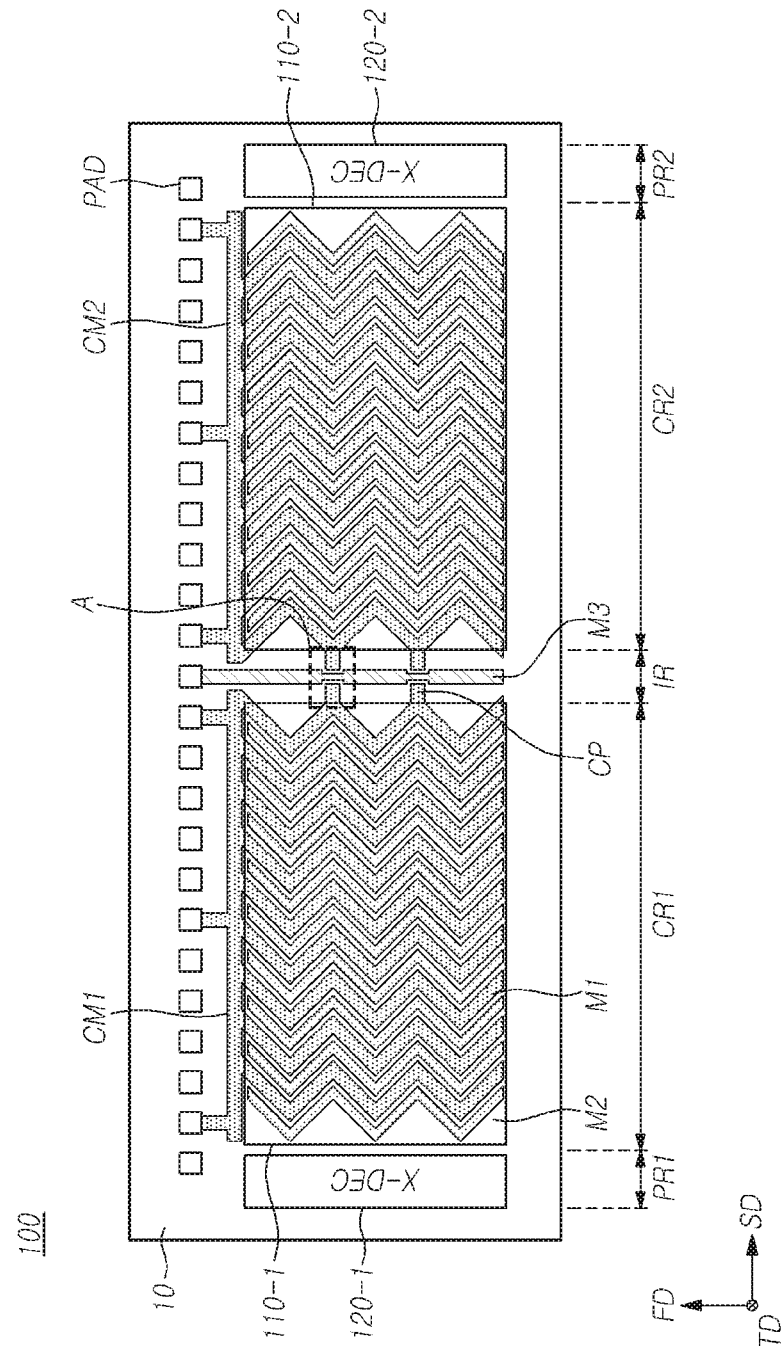
FIG. 6 is a top view schematically illustrating an exemplary configuration of a semiconductor memory device in accordance with an embodiment of the present disclosure.
Figure 7:
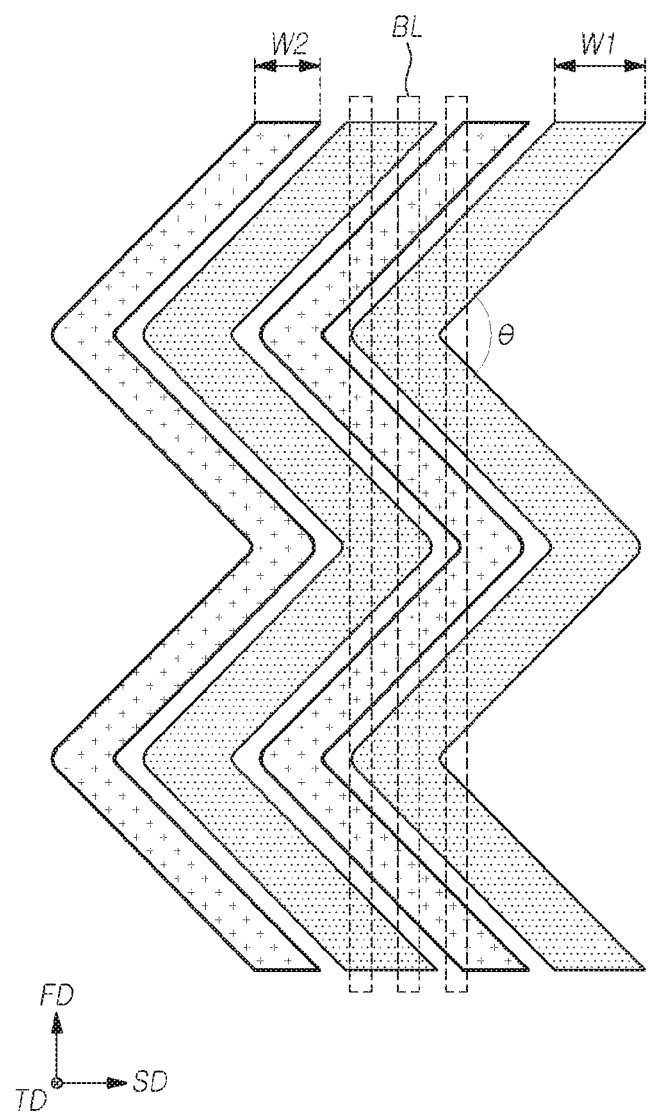
FIG. 7 is a top view illustrating an exemplary configuration of the layout relationship between bit lines and first and second wirings.
Figure 8:
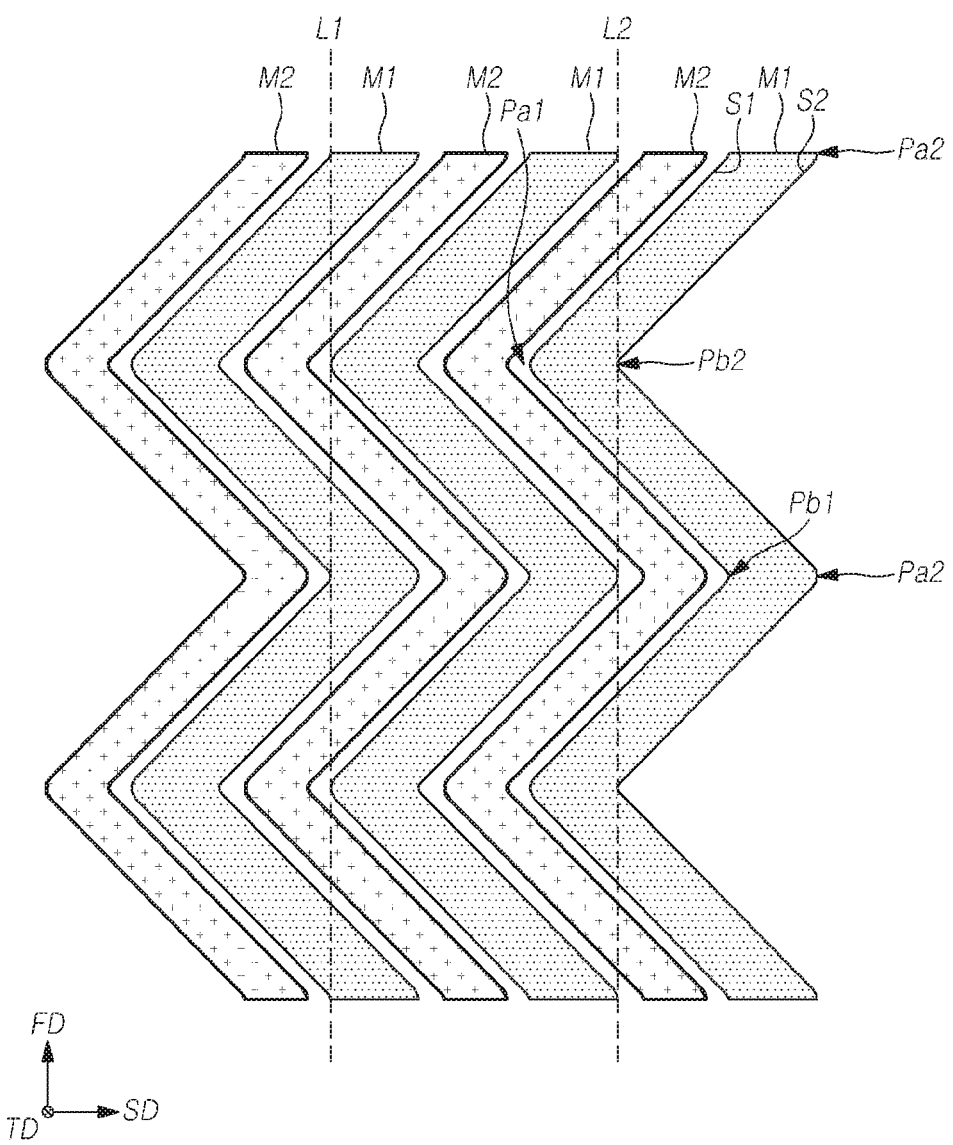
FIG. 8 is a top view illustrating an exemplary configuration of the structures of the first and second wirings.
Figure 9:
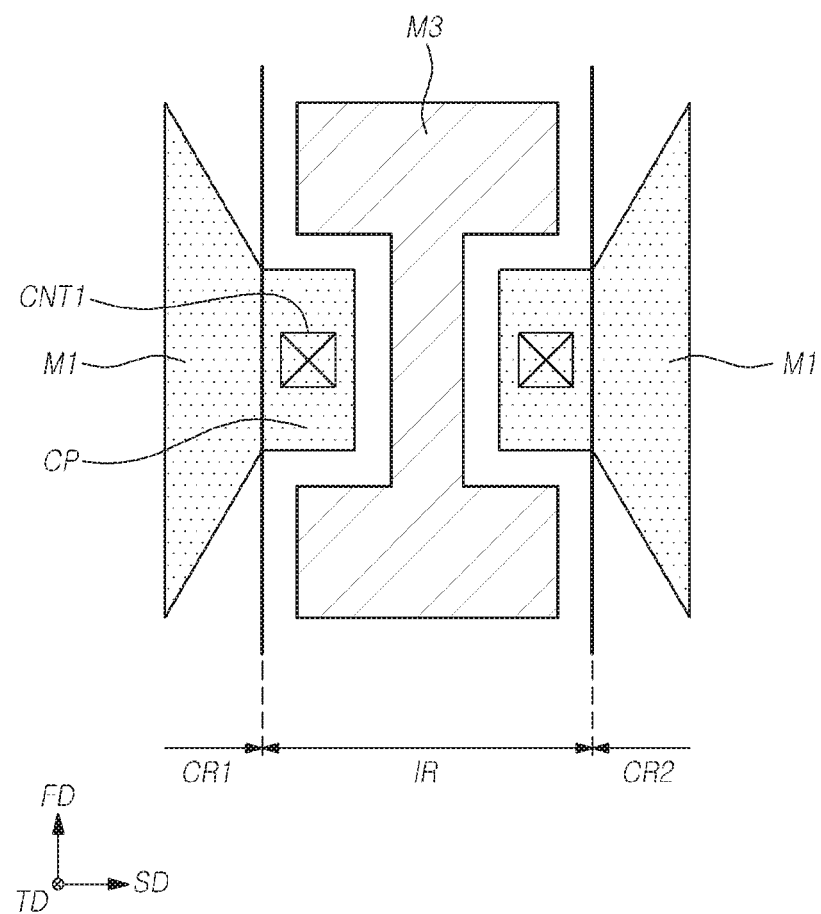
FIG. 9 is an enlarged top view illustrating the part A of FIG. 6.

FIG. 6 is a top view schematically illustrating an exemplary configuration of the semiconductor memory device in accordance with an embodiment, FIG. 7 is a top view illustrating an exemplary configuration of the layout relationship between bit lines and first and second wirings, FIG. 8 is a top view illustrating an exemplary configuration of the structures of the first and second wirings, and FIG. 9 is an enlarged top view illustrating the part A of FIG. 6.

Referring to FIGS. 6 and 7, the first wirings M1 and the second wirings M2 may be alternately disposed along the second direction SD in the first and second cell regions CR1 and CR2. The first and second wirings M1 and M2 may extend in the first direction FD as the extending direction of the bit lines BL while being bent into a zigzag shape.

The first and second wirings M1 and M2 may be formed through a photolithography process and an etching process. In the case where the bending angle θ of the first and second wirings M1 and M2 is small, a pattern distortion may occur by an optical proximity effect (OPE) in the photolithography process. While a pattern distortion may be corrected to some extent by using optical proximity correction (OPC), if the bending angle θ of the first and second wirings M1 and M2 is smaller than a threshold reference capable of enabling correction of a pattern distortion by the optical proximity correction (OPC), the pattern distortion cannot be corrected even by the OPC. Therefore, the bending angle θ of the first and second wirings M1 and M2 should have a value equal to or larger than the threshold reference capable of enabling correction of a pattern distortion by the OPC. The threshold reference may be 90 degrees.

The width of the first wirings M1 in the second direction SD may be constant as a first width W1, and the width of the second wirings M2 in the second direction SD may be constant as a second width W2. While it is illustrated in the present embodiment that the second width W2 is smaller than the first width W1, it is to be noted that the present disclosure is not limited thereto. The second width W2 may be the same as the first width W1 or may be larger than the first width W1. The first width W1 and the second width W2 can be changed according to the required specification.

Referring to FIG. 8, each of the first wirings M1 may have a pair of side surfaces S1 and S2 which face away from each other. One side surface S1 of each of the first wirings M1 may have a zigzag shape in which a plurality of first convex portions Pa1 and a plurality of first concave portions Pb1 are alternately repeated, and the other side surface S2 may have a zigzag shape in which a plurality of second concave portions Pb2 and a plurality of second convex portions Pa2 are alternately repeated. The first convex portion Pa1 of one side surface S1 and the second concave portion Pb2 of the other side surface S2 may form a pair while facing away from each other in the second direction SD, and the first concave portion Pb1 of one side surface S1 and the second convex portion Pa2 of the other side surface S2 may form a pair while facing away from each other in the second direction SD. Each of the first and second convex portions Pa1 and Pa2 and the first and second concave portions Pb1 and Pb2 may have not a pointed end but a rounded end. Unlike the present embodiment, in the case where each of the first and second convex portions Pa1 and Pa2 and the first and second concave portions Pb1 and Pb2 has a pointed end, as electric fields are concentrated in the first and second convex portions Pa1 and Pa2 and the first and second concave portions Pb1 and Pb2, electrical characteristics may degrade. In the present embodiment, since each of the first and second convex portions Pa1 and Pa2 and the first and second concave portions Pb1 and Pb2 has a rounded end, an electric field concentration phenomenon may be suppressed.

Each first wiring M1 may be formed such that the first convex portions Pa1 on one side surface S1 thereof are aligned in a line along the first direction FD with the first concave portions Pb1 of an adjacent first wiring M1 which faces the one side surface S1. Namely, the first convex portions Pa1 of the first wiring M1 and the first concave portions Pb1 of the adjacent first wiring M1 which faces the one side surface S1 of the first wiring M1 may be arranged on a first virtual straight line L1 extending along the first direction FD.

Each first wiring M1 may be formed such that the second convex portions Pa2 on the other side surface S2 thereof are aligned in a line along the first direction FD with the second concave portions Pb2 of an adjacent first wiring M1 which faces the other side surface S2. Namely, the second convex portions Pa2 of the first wiring M1 and the second concave portions Pb2 of the adjacent first wiring M1 which faces the other side surface S2 of the first wiring M1 may be arranged on a second virtual straight line L2 extending along the first direction FD. The second wirings M2 may be disposed between the first wirings M1 side by side with the first wirings M1, and may be formed into substantially the same shape as the first wirings M1.

Referring again to FIG. 6, the first wirings M1 disposed over the first plane 110-1 may be coupled in parallel to a first common wiring CM1, and the first wirings M1 disposed over the second plane 110-2 may be coupled in parallel to a second common wiring CM2. The first and second common wirings CM1 and CM2 may be laid out between the pads PAD and the first and second planes 110-1 and 110-2, and each of them may be electrically coupled to at least one of the pads PAD. The pads PAD electrically coupled to the first and second common wirings CM1 and CM2 may be input/output pads for a ground voltage.

Referring to FIGS. 5, 6 and 9, the convex portions of first wirings M1 which are disposed at the edges of the first and second cell regions CR1 and CR2, among the first wirings M1, may be exposed to the outsides of the first and second cell regions CR1 and CR2, for example, to the interval region IR between the first cell region CR1 and the second cell region CR2. Contact pads CP may be disposed in the interval region IR. The contact pads CP may be respectively coupled to the convex portions of the first wirings M1 which are disposed at the edges of the first and second cell regions CR1 and CR2. The contact pads CP may be electrically coupled to the underlying logic structure P through electrical paths which are defined in the interval region IR.

For example, as shown in FIG. 5, the contact pads CP may be coupled to wirings TM1 which are formed on the third top dielectric layer 53, through contacts CNT1 which pass through the fourth top dielectric layer 54 of the interval region IR. The wirings TM1 may be electrically coupled to the bottom wirings UM of the logic structure P through contacts CNT2 which pass through the first to third top dielectric layers 51 to 53 and the third bottom dielectric layer 23 of the interval region IR.

In the present embodiment configured as mentioned above, by forming the first wirings M1 and the second wirings M2 to be bent into a zigzag shape, deviations in areas where the bit lines BL overlap with the first wirings M1 and deviations in areas where the bit lines BL overlap with the second wirings M2 may be reduced. Due to this fact, because deviations in coupling capacitances among the bit lines BL are reduced, variation in the distributions of the memory cells coupled to the bit lines BL may be suppressed.

Further, by forming the first wirings M1 to be bent into a zigzag shape and disposing contact pads at the convex portions of the first wirings M1 which are positioned at the edges of the cell regions CR1 and CR2, the number of electrical paths which couple the first wirings M1 and the underlying logic circuits may be increased. As a consequence, the bouncing of a voltage to be transferred to the logic circuits may be suppressed, and the operational characteristics of a semiconductor memory device may be improved.

Figure 10:
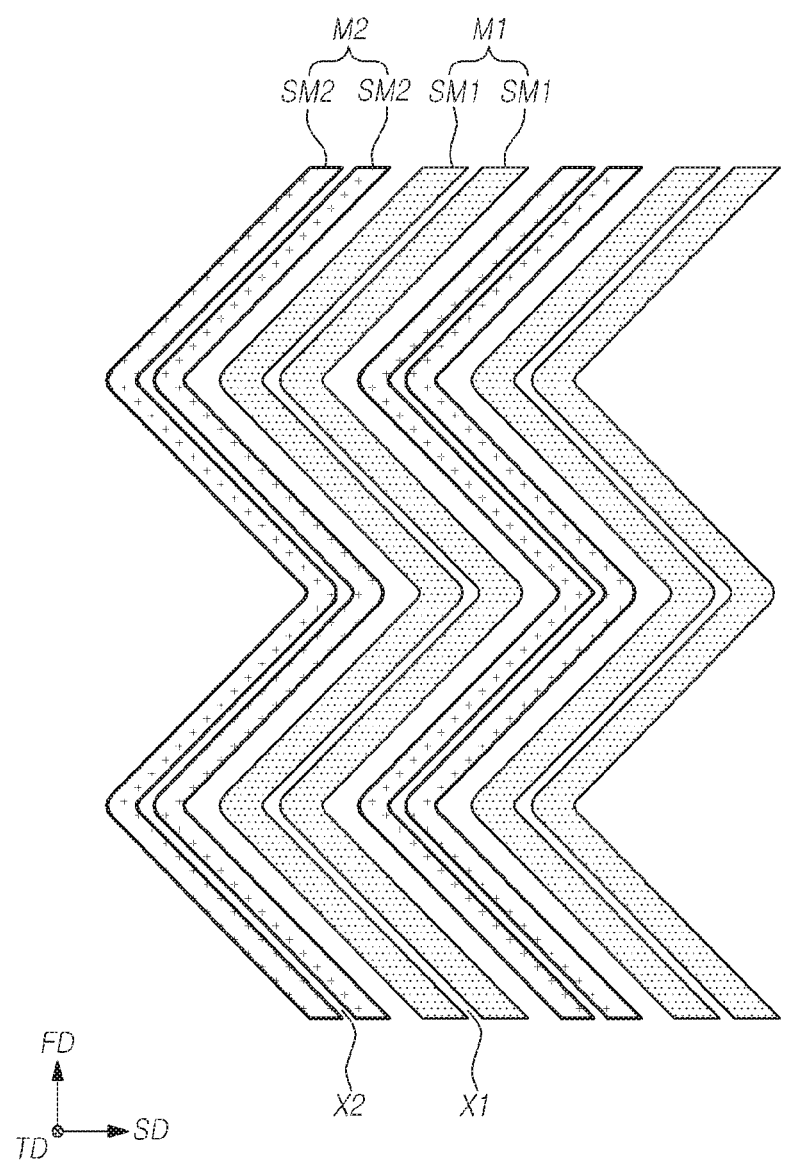
FIG. 10 is a top view illustrating an exemplary configuration of the first and second wirings of a semiconductor memory device in accordance with an embodiment of the present disclosure.

FIG. 10 is a top view schematically illustrating an exemplary configuration of the first and second wirings of a semiconductor memory device in accordance with an embodiment of the present disclosure.

Referring to FIG. 10, each of the first and second wirings M1 and M2 may have a crack suppressing structure. In detail, a first slit X1 may be formed in each of the first wirings M1. The first slit X1 may extend in the first direction FD as the extending direction of bit lines BL while being bent into a zigzag shape. Each of the first wirings M1 may be divided into a plurality of first sub wirings SM1 by the first slit X1. The widths of the first sub wirings SM1 that are measured in the second direction SD may be the same to each other. In this case, the width of the first sub wiring SM1 measured in the second direction SD may have a size smaller than half of the width (W1 of FIG. 7) of the first wiring M1 measured in the second direction SD.

Similarly to the first wirings M1, a second slit X2 may be formed in each of the second wirings M2. The second slit X2 may extend in the first direction FD as the extending direction of the bit lines BL while being bent into a zigzag shape. Each of the second wirings M2 may be divided into a plurality of second sub wirings SM2 by the second slit X2. The widths of the second sub wirings SM2 that are measured in the second direction SD may be the same to each other. In this case, the width of the second sub wiring SM2 measured in the second direction SD may have a size smaller than half of the width (W2 of FIG. 7) of the second wiring M2 measured in the second direction SD.

A semiconductor memory device may be commercialized through an individualization process and a packaging process after being manufactured on a wafer. In the individualization process and the packaging process, a stress may be applied to a semiconductor memory device, and cracks may occur in the first and second wirings M1 and M2 due to the stress. The slits X1 and X2 formed in the first and second wirings M1 and M2 may suppress propagation of cracks by absorbing and/or reflecting a stress. That is to say, propagation of cracks may be suppressed as the cracks are delimited by the slits X1 and X2.

According to the present embodiment, since propagation of cracks is suppressed by the slits X1 and X2 defined in the first and second wirings M1 and M2, an open failure of the first and second wirings M1 and M2 may be reduced.

Figure 11:
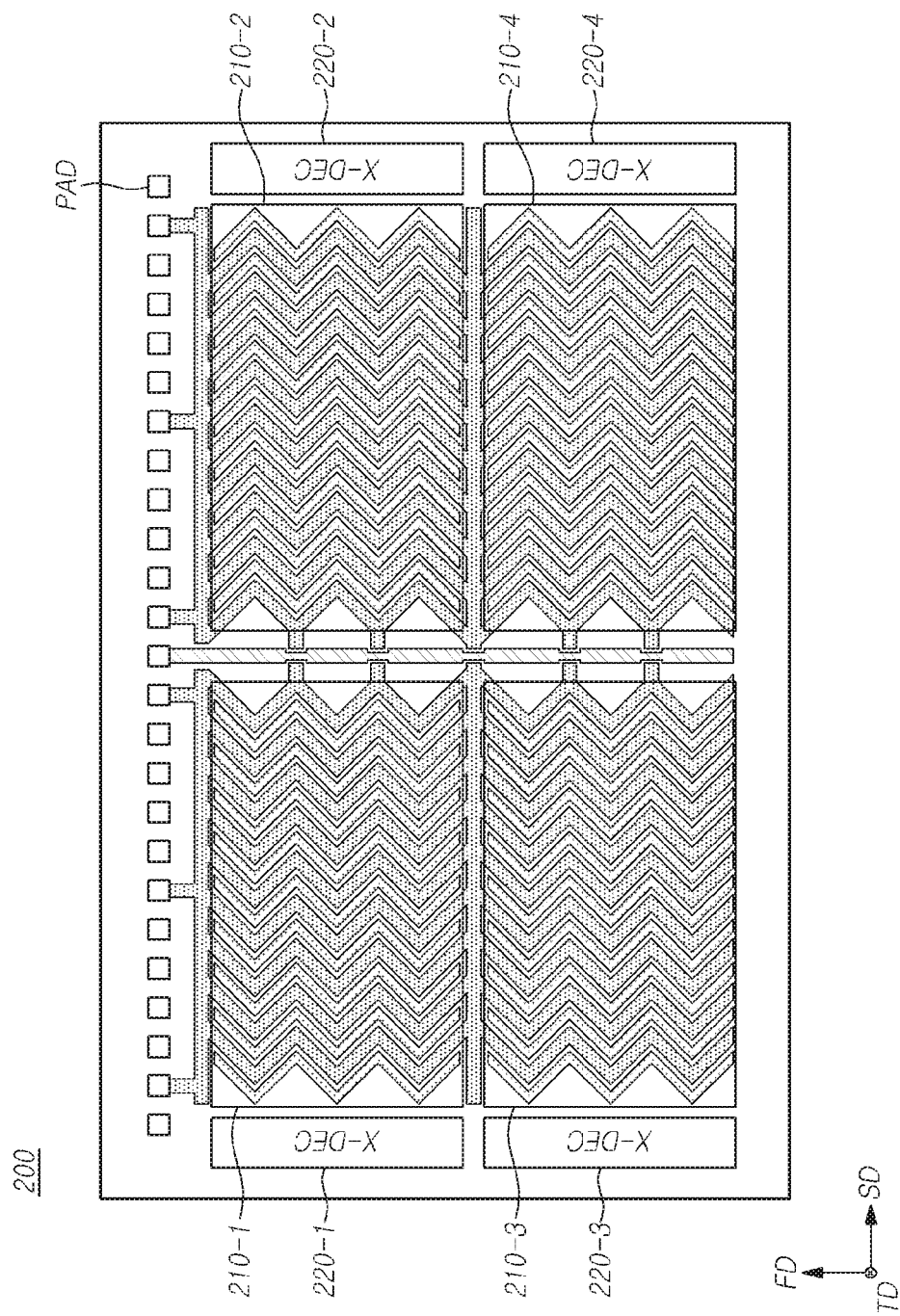
FIG. 11 is a top view schematically illustrating an exemplary configuration of a semiconductor memory device in accordance with an embodiment of the present disclosure.

FIG. 11 is a top view schematically illustrating an exemplary configuration of a semiconductor memory device in accordance with an embodiment of the present disclosure.

Referring to FIG. 11, planes 210-1 to 210-4 may be laid out in the form of a 2×2 matrix along the first direction FD and the second direction SD. While it is illustrated in the present embodiment that the number of planes laid out along the first direction FD is 2, it is to be noted that the present disclosure is not limited thereto. The number of planes to be laid out along the first direction FD may be 3 or more.

First wirings M1 may be used to transfer a signal to be commonly provided to the planes 210-1 to 210-4. Second wirings M2 may be used to transfer a signal to be individually provided to the respective planes 210-1 to 210-4. For example, the first wirings M1 may be used to transfer a ground voltage (VSS), and the second wirings M2 may be used to transfer a source voltage (VSL).

First wirings M1 which are disposed on the planes 210-1 and 210-3 laid out in a line along the first direction FD may be electrically coupled with each other, and first wirings M1 which are disposed on the planes 210-2 and 210-4 laid out in a line along the first direction FD may be electrically coupled with each other. The second wirings M2 which are disposed on the different planes 210-1 to 210-4 may be electrically isolated from one another.

A third coupling wiring CM3 may be disposed between the is first and third planes 210-1 and 210-3 which are laid out in a line along the first direction FD, and the first wirings M1 which are positioned on the first and third planes 210-1 and 210-3 may be coupled in common to the third coupling wiring CM3. Similarly, a fourth coupling wiring CM4 may be disposed between the second and fourth planes 210-2 and 210-4 which are laid out in a line along the first direction FD, and the first wirings M1 which are positioned on the second and fourth planes 210-2 and 210-4 may be coupled in common to the fourth coupling wiring CM4.

Figure 12:
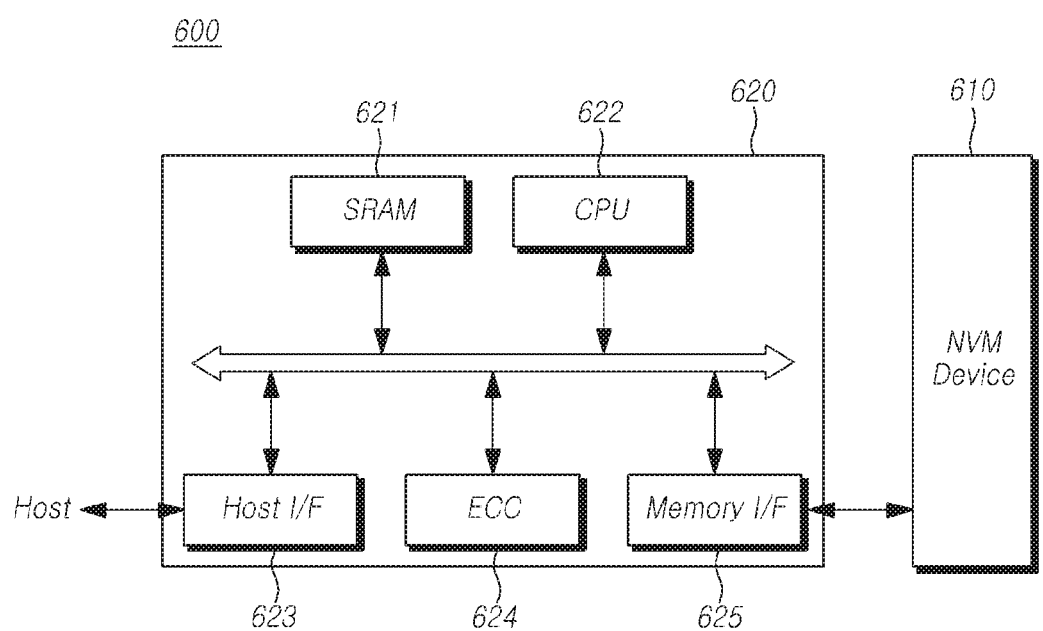
FIG. 12 is a diagram schematically illustrating an exemplary configuration of a memory system including a semiconductor memory device in accordance with an embodiment of the present disclosure.

FIG. 12 is a simplified block diagram schematically illustrating a memory system including a semiconductor memory device according to an embodiment of the present invention.

Referring to FIG. 12, the memory system 600 may include the semiconductor memory device 610 and a memory controller 620.

The semiconductor memory device 610 may be comprised the semiconductor memory device according to an embodiment of the invention as described above, and may be operated in the manner described above. The memory controller 620 may control the semiconductor memory device 610. For example, the combination of the semiconductor memory device 610 and the memory controller 620, may be configured as a memory card or a solid state disk (SSD). The memory controller 620 may include an SRAM 621, a central processing unit (CPU) 622, a host interface 623, an ECC block 624, and a memory interface 625.

The SRAM 621 may be used as the working memory of the CPU 622. The host interface 623 may include the data exchange protocol of a host which may be coupled with the memory system 600.

The ECC block 624 may detect and correct an error included in the data read out from the semiconductor memory device 610.

The memory interface 625 may interface with the semiconductor memory device 610. The CPU 622 may perform general control operations for data exchange of the memory controller 620.

Although not shown, it should become apparent to a person skilled in the art that the memory system 600 may further be provided with a ROM which stores code data for interfacing with the host. The semiconductor memory device 610 may be provided as a mufti-chip package constructed by a plurality of flash memory chips.

The memory system 600 may be used as a storage medium of high reliability having a low probability of an error occurring. The aforementioned nonvolatile memory device may be provided for a memory system such as a solid state disk (SSD). The memory controller 620 may communicate with an external device (for example, the host) through one of various interface protocols such as a USB (universal serial bus) protocol, an MMC (multimedia card) protocol, a PCI-E (peripheral component interconnection express) protocol, an SATA (serial advanced technology attachment) protocol, a PATA (parallel advanced technology attachment) protocol, an SCSI (small computer system interface) protocol, an ESDI (enhanced small disk interface) protocol and an IDE (integrated device electronics) protocol and the like.

Figure 13:
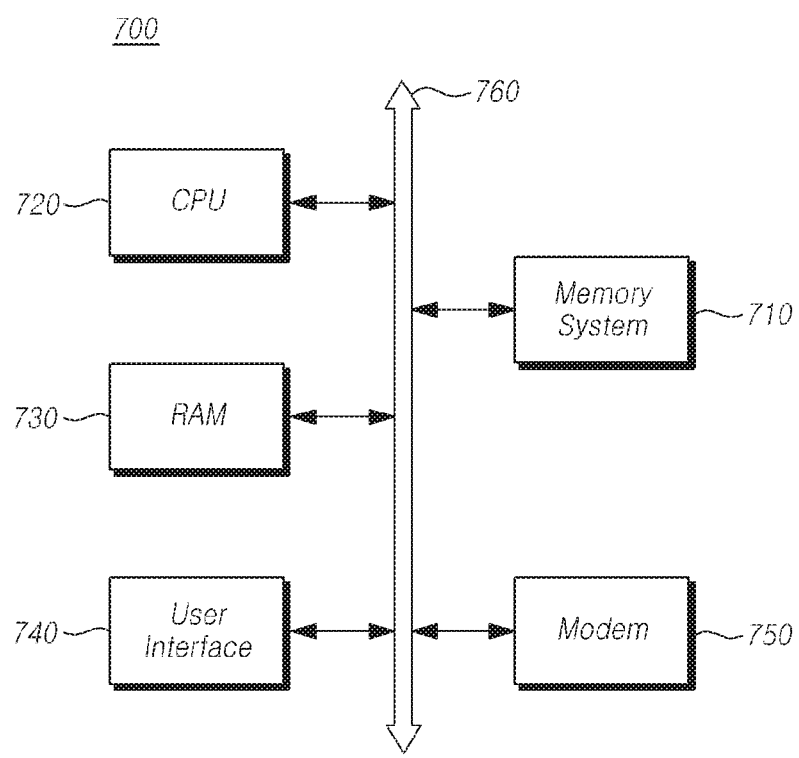
FIG. 13 is a block diagram schematically illustrating an exemplary configuration of a computing system including a semiconductor memory device in accordance with an embodiment of the present disclosure.

FIG. 13 is a simplified block diagram schematically illustrating a computing system including a semiconductor memory device, according to an embodiment of the present invention.

Referring to FIG. 13, a computing system 700 according to an embodiment may include a memory system 710, a microprocessor (or CPU) 720, a RAM 730, a user interface 740, a modem 750 such as a baseband chipset, which are electrically coupled to a system bus 760. In an embodiment, the computing system 700 may be a mobile device, in which case a battery (not shown) for supplying the operating voltage of the computing system 700 may be additionally provided. Although not shown in the drawing, it should become apparent to a person skilled in the art that the computing system 700 may further comprise an application chipset, a COMS image sensor (CIS), a mobile DRAM, and so on. The memory system 710 may be configured, for example, as an SSD (solid state drive/disk) which uses a nonvolatile memory to store data. Also as an example, the memory system 710 may be provided as a fusion flash memory (for example, a NAND or a NOR flash memory).

It is noted that the above-described embodiments are not realized only by a device and a method, but may be realized also by a program which performs a function corresponding to the configuration of each embodiment or a recording medium on which the program is recorded. Such realization may be easily derived from the descriptions of the above-described embodiments by a person skilled in the art to which the embodiments pertain.

Although various embodiments have been described for illustrative purposes, it will be apparent to those skilled in the art that various changes and modifications may be made without departing from the spirit and scope of the invention as defined in the following claims.

What is claimed is:

1. A semiconductor memory device comprising:
a plurality of bit lines disposed over memory cells; and
a plurality of first and second wirings alternately disposed along a second direction over the bit lines, and extending in a first direction intersecting with the second direction while being bent into zigzag shapes.

2. The semiconductor memory device according to claim 1, wherein the bit lines disposed along the second direction, and extending in the first direction.

3. The semiconductor memory device according to claim 1, further comprising:
a source plate supporting the memory cells; and
a logic circuit disposed over a substrate below the source plate,
wherein the first wirings are electrically coupled with the logic circuit, and the second wirings are electrically coupled with the source plate.

4. The semiconductor memory device according to claim 1, wherein a ground voltage is supplied to the first wirings, and a source voltage is supplied to the second wirings.

5. The semiconductor memory device according to claim 1,
wherein each of the first wirings includes a plurality of convex portions and a plurality of concave portions on each of one surface and the other surface which face away from each other in the second direction,
wherein convex portions which are disposed on one surface of each first wiring are aligned along the first direction with concave portions which are disposed on one surface of an adjacent first wiring facing the one surface of each first wiring, and
wherein convex portions which are disposed on the other surface of each first wiring are aligned along the first direction with concave portions which are disposed on the other surface of an adjacent first wiring facing the other surface of each first wiring.

6. The semiconductor memory device according to claim 1,
wherein each of the second wirings includes a plurality of convex portions and a plurality of concave portions on each of one surface and the other surface which face away from each other in the second direction,
wherein convex portions which are disposed on one surface of each second wiring are aligned in the first direction with concave portions which are disposed on one surface of an adjacent second wiring facing the one surface of each second wiring, and
wherein convex portions which are disposed on the other surface of each second wiring are aligned in the first direction with concave portions which are disposed on the other surface of an adjacent second wiring facing the other surface of each second wiring.

7. The semiconductor memory device according to claim 1, wherein each of the first and second wirings includes a crack suppressing structure.

8. The semiconductor memory device according to claim 7, wherein the crack suppressing structure includes a slit dividing each of the first and second wirings into a plurality of sub wirings.

9. The semiconductor memory device according to claim 8, wherein the slit extends in the first direction while being bent into a zigzag shape.

10. A semiconductor memory device comprising:
a plane disposed in a cell region, and including a plurality of memory cells;
a plurality of bit lines disposed over the plane along a second direction intersecting with a first direction, and extending in the first direction;
a plurality of wirings disposed over the bit lines along the second direction, and extending in the first direction while being bent into zigzag shapes; and
a plurality of contact pads respectively coupled to convex portions of a wiring which is positioned at an edge of the cell region.

11. The semiconductor memory device according to claim 10, wherein the convex portions of the wiring which is positioned at the edge of the cell region are exposed to an outside of the cell region, and the contact pads are disposed outside the cell region.

12. The semiconductor memory device according to claim 10,
wherein the wirings include a plurality of first wirings and a plurality of second wirings which are alternately disposed along the second direction, and
wherein the contact pads are coupled to a first wiring which is positioned at the edge of the cell region.

13. The semiconductor memory device according to claim 12, further comprising:
a source plate supporting the plane, and electrically coupled to the second wirings;
a logic circuit disposed over a substrate below the source plate; and
a plurality of contacts electrically coupling the contact pads and the logic circuit.

14. A semiconductor memory device comprising:
a plurality of planes each including a plurality of memory cells;
a plurality of bit lines disposed over the planes along a second direction intersecting with a first direction, and extending in the first direction; and
a plurality of first wirings and a plurality of second wirings alternately disposed along the second direction over the bit lines, and extending in the first direction while being bent into zigzag shapes.

15. The semiconductor memory device according to claim 14,
wherein the planes include a first plane and a second plane which are disposed along the second direction, and
is wherein the semiconductor memory device further comprises:
contact pads respectively coupled to convex portions of a first wiring which is disposed at an edge of a first cell region where the first plane is positioned and convex portions of a first wiring which is disposed at an edge of a second cell region where the second plane is positioned.

16. The semiconductor memory device according to claim 15, wherein the convex portions of the first wirings which are positioned at the edges of the first and second cell regions are exposed to an interval region between the first cell region and the second cell region, and the contact pads are disposed in the interval region.

17. The semiconductor memory device according to claim 16, further comprising:
a source plate supporting the planes, and electrically coupled to the second wirings;
a logic circuit disposed over a substrate below the source plate; and
a plurality of contacts disposed in the interval region, and electrically coupling the contact pads and the logic circuit.

18. The semiconductor memory device according to claim 16, further comprising:
a third wiring disposed in the interval region at the same layer as the first and second wirings, and extending in the first direction.

19. The semiconductor memory device according to claim 14, wherein the planes are disposed along the first direction and the second direction, and wherein first wirings which are positioned over planes disposed along the first direction are electrically coupled with each other, and second wirings which are positioned over different planes are electrically isolated from each other.

20. The semiconductor memory device according to claim 19, further comprising:

a coupling wiring positioned between the planes disposed along the first direction, and coupled in common with the first wirings which are positioned over the planes disposed along the first direction.

* * * * *